US 9,862,571 B2

United States Patent
Sun et al.

(10) Patent No.: US 9,862,571 B2
(45) Date of Patent: Jan. 9, 2018

(54) ELEVATOR CORD HEALTH MONITORING

(71) Applicant: OTIS ELEVATOR COMPANY, Farmington, CT (US)

(72) Inventors: Fanping Sun, Glastonbury, CT (US); Xiaodong Luo, South Windsor, CT (US); Daniel A. Mosher, Glastonbury, CT (US); Huan Zhang, Glastonbury, CT (US); John P. Wesson, West Hartford, CT (US); Yan Chen, South Windsor, CT (US); Mark Steven Thompson, Tolland, CT (US); Raja Kountanya, Manchester, CT (US); Richard N. Fargo, Plainville, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 0 days.

(21) Appl. No.: 14/768,667

(22) PCT Filed: Feb. 21, 2013

(86) PCT No.: PCT/US2013/027013
§ 371 (c)(1),
(2) Date: Aug. 18, 2015

(87) PCT Pub. No.: WO2014/130028
PCT Pub. Date: Aug. 28, 2014

(65) Prior Publication Data
US 2016/0002006 A1    Jan. 7, 2016

(51) Int. Cl.
*B66B 7/06* (2006.01)
*B66B 7/12* (2006.01)
(Continued)

(52) U.S. Cl.
CPC .............. *B66B 7/1223* (2013.01); *B66B 9/00* (2013.01); *G01R 17/00* (2013.01); *G01R 31/12* (2013.01);
(Continued)

(58) Field of Classification Search
CPC ... B66B 5/0025; B66B 5/0031; B66B 7/1223; B66B 7/064
(Continued)

(56) References Cited

U.S. PATENT DOCUMENTS 2,657,352 A * 10/1953 Sink ........................ G01R 17/00
323/352
3,958,455 A * 5/1976 Russell ................... G01L 5/101
338/5
(Continued)

FOREIGN PATENT DOCUMENTS

CN    1185407 A    6/1998
CN    1613740 A    5/2005
(Continued)

OTHER PUBLICATIONS

Notification of Transmittal of the International Search Report and the Written Opinion of the International Searching Authority; PCT/US2013/027013; Mailed Nov. 27, 2013; ISR 5 Pages, WO 6 pages.
(Continued)

Primary Examiner — William A Rivera
Assistant Examiner — Stefan Kruer
(74) Attorney, Agent, or Firm — Cantor Colburn LLP

(57) ABSTRACT

A method of fault detection of a belt or rope includes interconnecting a plurality of cords of the belt or rope, the cords including a plurality of wires, to form a bridge circuit. A fault detection bridge circuit is subjected to a voltage
(Continued)

excitation and outputs a voltage which is indicative of the belt or rope damage but remaining insensitive to other environmental noises.

21 Claims, 8 Drawing Sheets

(51) Int. Cl.
  *B66B 5/00* (2006.01)
  *G01R 17/00* (2006.01)
  *G01R 31/12* (2006.01)
  *B66B 9/00* (2006.01)

(52) U.S. Cl.
  CPC .... *D07B 2301/307* (2013.01); *D07B 2301/45* (2013.01); *D07B 2501/2007* (2013.01)

(58) Field of Classification Search
  USPC .................................................. 187/391–393
  See application file for complete search history.

(56) References Cited

U.S. PATENT DOCUMENTS

| | | | |
|---|---|---|---|
| 6,021,873 A | 2/2000 | Aulanko et al. | |
| 6,316,970 B1* | 11/2001 | Hebert | H03F 3/45506 327/560 |
| 7,123,030 B2* | 10/2006 | Robar | B66B 7/1223 187/393 |
| 2001/0045835 A1 | 11/2001 | Ahmed | |
| 2002/0171234 A1 | 11/2002 | Stephen et al. | |
| 2002/0194935 A1 | 12/2002 | Clarke et al. | |
| 2005/0063449 A1* | 3/2005 | Lustenberger | B66B 7/1223 374/4 |
| 2008/0105059 A1* | 5/2008 | Turnbull | D07B 1/145 73/779 |
| 2009/0178902 A1 | 7/2009 | Lynn et al. | |
| 2011/0148442 A1* | 6/2011 | Berner | B66B 7/1223 324/691 |
| 2011/0253487 A1* | 10/2011 | Kocher | B66B 7/1223 187/393 |
| 2013/0162266 A1* | 6/2013 | Fargo | B66B 7/1223 324/601 |

FOREIGN PATENT DOCUMENTS

| | | |
|---|---|---|
| CN | 101946174 A | 1/2011 |
| CN | 102256888 A | 11/2011 |
| EP | 2935071 A1 | 10/2015 |

OTHER PUBLICATIONS

State Intellectual Property Office of People's Republic China; Application No. 201380073605.7; Dated Aug. 22, 2016; 2 pages.
European Search Report and Communication; Application No. 13875665.5-1705; Dated Sep. 28, 2016; 8 pages.
Chinese Office Action issued in CN Application No. 201380073605.7, dated Sep. 14, 2017, 13 pages.

* cited by examiner

ELEVATOR CORD HEALTH MONITORING

BACKGROUND OF THE INVENTION

The subject matter disclosed herein relates to belts or ropes used, for example, in elevator systems. More specifically, the subject disclosure relates to fault detection (e.g. of corrosion, fatigue, wear, etc.) of belts or ropes used for elevator suspension and/or driving.

Elevator systems utilize ropes or belts operably connected to an elevator car, and routed over one or more pulleys, also known as sheaves, to propel the elevator car along a hoistway. Coated steel belts in particular include a plurality of wires located at least partially within a jacket material. The plurality of wires is often arranged into one or more strands and the strands are then arranged into one or more cords. In an exemplary belt construction, a plurality of cords is typically arranged equally spaced within a jacket in a longitudinal direction.

During normal elevator operation, coated steel belts and ropes are subject to various failures due to fatigue, wear and corrosion over the time of their service which could progressively lead to a catastrophic consequence. It is desirable to have an online health monitoring system for early warning of structural compromise at low cost. The prevalent technology for real time health monitoring of ferromagnetic rope is magnetic flux leakage (MFL) based inspection which could provide adequate detection of minor rope damage but the system is complex, bulky and costly to elevator industry. Resistance based inspection (RBI) is a low cost and popular method for steel cord reinforced belt inspection. However, it lacks of sensitivity for early warning and ability to detect all the common failure modes of the ropes and belts. Dynamic measurement of extremely low resistance multi-strand cords subject to electromagnetic interference or "noise" and/or thermal or mechanical variations presents major challenges relative to interference resistance and signal to noise ratio of the system. A method of continuous monitoring elevator for early warning of wire rope or steel belt damage with low cost is highly desirable.

BRIEF DESCRIPTION OF THE INVENTION

According to one aspect of the invention, a method of fault detection of a belt or rope includes interconnecting a plurality of cords of the belt or rope, the cords including a plurality of wires, to form a bridge circuit. The bridge circuit is subjected to an excitation voltage and outputs a signal voltage, the bridge circuit structure suppressing environmental noise to increase signal to noise ratio of the signal voltage. The signal voltage is monitored to detect a fault condition of the rope.

According to this or other aspects of the invention, the method includes comparing a profile of the measured electrical impedance to a baseline electrical impedance profile and determining a fault condition of the belt or rope via the comparison.

According to this or other aspects of the invention, each leg of the bridge circuit includes at least one cord of the belt or rope.

According to this or other aspects of the invention, each leg of the bridge circuit includes two or more cords of the belt or rope.

According to this or other aspects of the invention, fault conditions include wire breakage, fretting and/or birdcaging.

According to this or other aspects of the invention, the method further includes switching the interconnection of the plurality of cords via a switching mechanism operably connected to the plurality of cords.

According to this or other aspects of the invention, the belt or rope is a coated belt or rope.

According to this or other aspects of the invention, at least one leg of the bridge circuit is a fixed resistor.

According to this or other aspects of the invention, two legs of the bridge circuit each comprise at least one cord and two legs of the bridge circuit each comprise a fixed resistor.

According to another aspect of the invention, an elevator system includes an elevator car and one or more sheaves. A belt or rope having a plurality of wires arranged into a plurality of cords for supporting and/or driving the elevator car is routed across the one or more sheaves and is operably connected to the elevator car. The plurality of cords are interconnected to form a bridge circuit.

The detailed description explains the invention, together with advantages and features, by way of examples with reference to the drawings.

DETAILED DESCRIPTION OF THE INVENTION

Figure 1:
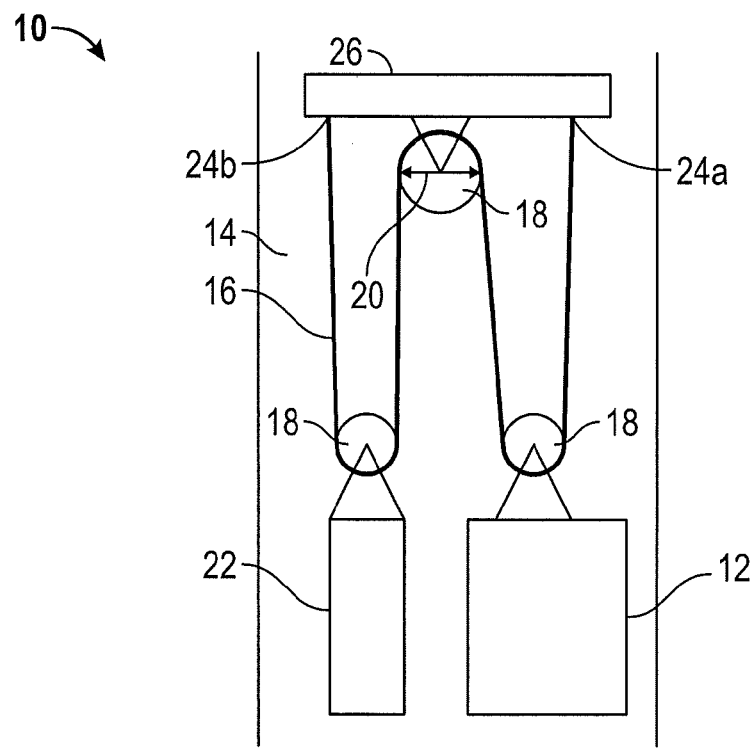
FIG. 1 is a schematic of an exemplary elevator system.
Figure 2:
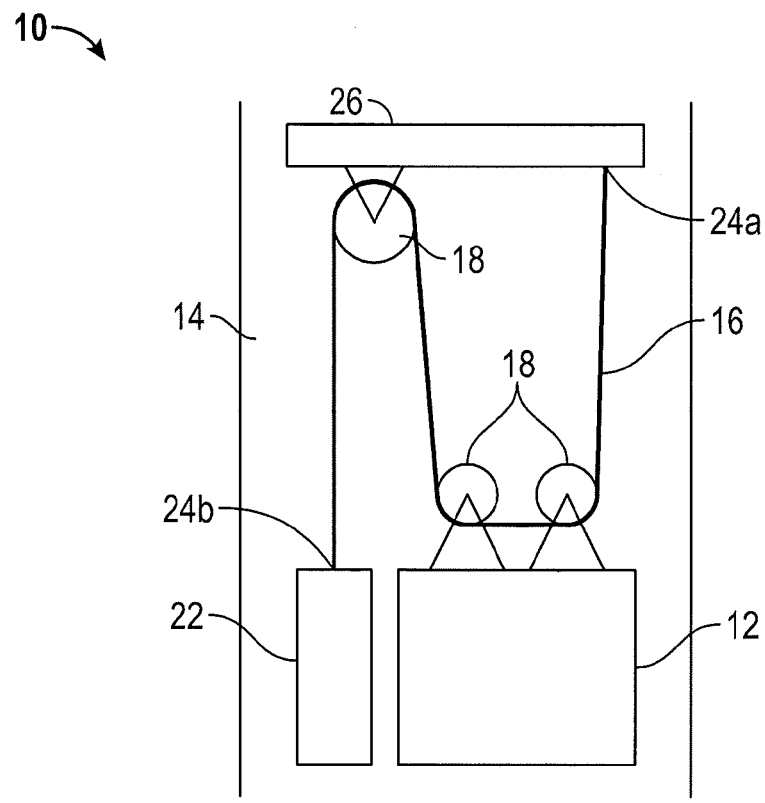
FIG. 2 is a schematic of another exemplary elevator system.

Shown in FIGS. 1 and 2 are schematics of exemplary traction elevator systems 10. Features of the elevator system 10 that are not required for an understanding of the present invention (such as the guide rails, safeties, etc.) are not discussed herein. The elevator system 10 includes an elevator car 12 operatively suspended or supported in a hoistway 14 with one or more belts 16 or ropes. The one or more belts 16 interact with one or more sheaves 18 to be routed around various components of the elevator system 10. The one or more belts 16 could also be connected to a counterweight 22, which is used to help balance the elevator system 10 and reduce the difference in belt tension on both sides of the traction sheave during operation. It is to be appreciated that while the embodiments herein are described as applied to coated steel belts, it is to be appreciated that the disclosure herein may similarly be applied to steel ropes, either coated or uncoated.

The sheaves 18 each have a diameter 20, which may be the same or different than the diameters of the other sheaves 18 in the elevator system 10. At least one of the sheaves 18 could be a drive sheave. A drive sheave is driven by a machine (not shown). Movement of the drive sheave by the machine drives, moves and/or propels (through traction) the one or more belts 16 that are routed around the drive sheave.

At least one of the sheaves 18 could be a diverter, deflector or idler sheave. Diverter, deflector or idler sheaves are not driven by a machine, but help guide the one or more belts 16 around the various components of the elevator system 10. Further, one or more of the sheaves 18, such as the diverter, deflector or idler sheaves, may have a convex shape or crown along its axis of rotation to assist in keeping the one or more belts 16 centered, or in a desired position, along the sheaves 18.

In some embodiments, the elevator system 10 could use two or more belts 16 for suspending and/or driving the elevator car 12. In addition, the elevator system 10 could have various configurations such that either both sides of the one or more belts 16 engage the one or more sheaves 18 (such as shown in the exemplary elevator systems in FIG. 1 or 2) or only one side of the one or more belts 16 engages the one or more sheaves 18.

FIG. 1 illustrates an elevator system 10 in which the elevator car 12 includes a sheave 18 around which the belt 16 is routed to support the elevator car 12. Similarly, the counterweight 22 includes a sheave 18 around which the belt 16 is routed to support the counterweight 22. Each end 24a and 24b of the belt 16 is terminated at a fixed location such as a support 26 or other fixed location of the elevator system 10. FIG. 2 illustrates an embodiment of an elevator system 10 in which, as in FIG. 1, the elevator car 12 includes a sheave 18 around which the belt 16 is routed to support the elevator car 12. In this embodiment, however, a first end 24a of the belt 16 is terminated at the support 26, while a second end 24b of the belt 16 is terminated at the counterweight 22 and is movable with the counterweight 22.

Figure 3:
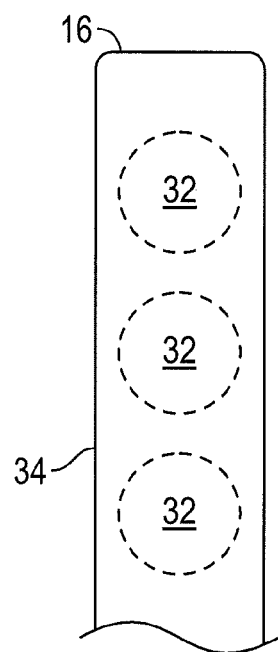
FIG. 3 is a cross-sectional view of an embodiment of an elevator belt.
Figure 4:
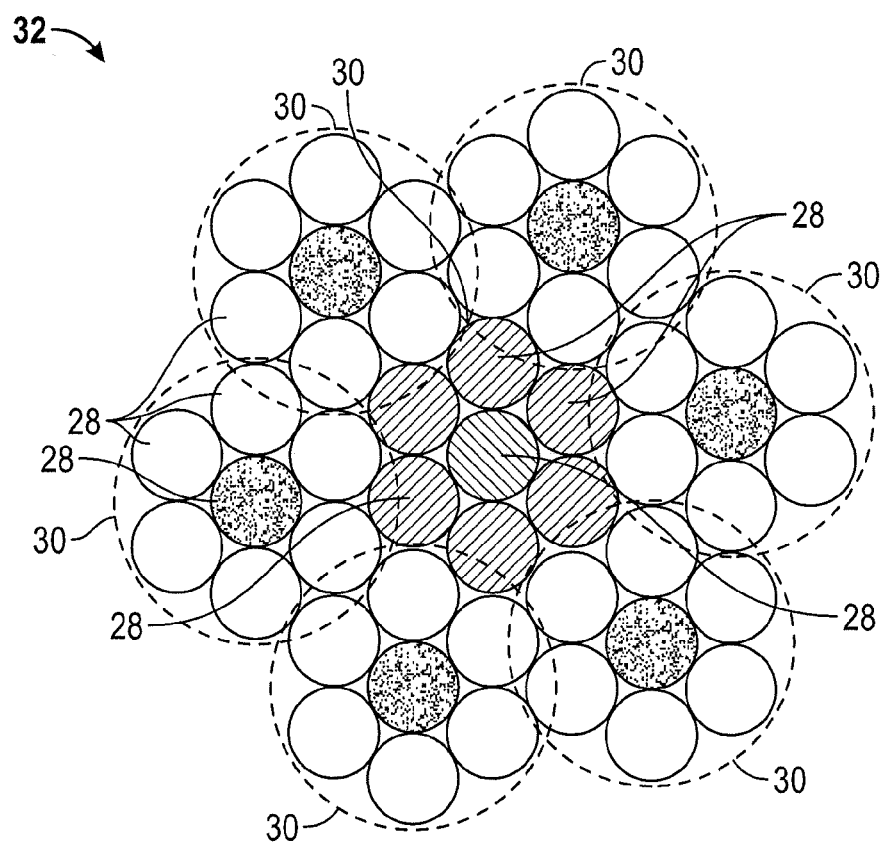
FIG. 4 is a cross-sectional view of an embodiment of a cord or rope.

FIG. 3 provides a schematic of a belt construction or design. Each belt 16 is constructed of a plurality of wires 28 (e.g. twisted into one or more strands 30 and/or cords 32 as shown in FIG. 4) in a jacket 34. As seen in FIG. 3, the belt 16 has an aspect ratio greater than one (i.e. belt width is greater than belt thickness). The belts 16 are constructed to have sufficient flexibility when passing over the one or more sheaves 18 to provide low bending stresses, meet belt life requirements and have smooth operation, while being sufficiently strong to be capable of meeting strength requirements for suspending and/or driving the elevator car 12. The jacket 34 could be any suitable material, including a single material, multiple materials, two or more layers using the same or dissimilar materials, and/or a film. In one arrangement, the jacket 26 could be a polymer, such as an elastomer, applied to the cords 32 using, for example, an extrusion or a mold wheel process. In another arrangement, the jacket 34 could be a woven fabric that engages and/or integrates the cords 32. As an additional arrangement, the jacket 34 could be one or more of the previously mentioned alternatives in combination.

The jacket 34 can substantially retain the cords 32 therein. The phrase substantially retain means that the jacket 34 has sufficient engagement with the cords 32 to transfer torque from the machine 50 through the jacket 34 to the cords 32 to drive movement of the elevator car 12. The jacket 34 could completely envelop the cords 32 (such as shown in FIG. 3), substantially envelop the cords 32, or at least partially envelop the cords 32.

Figure 5:
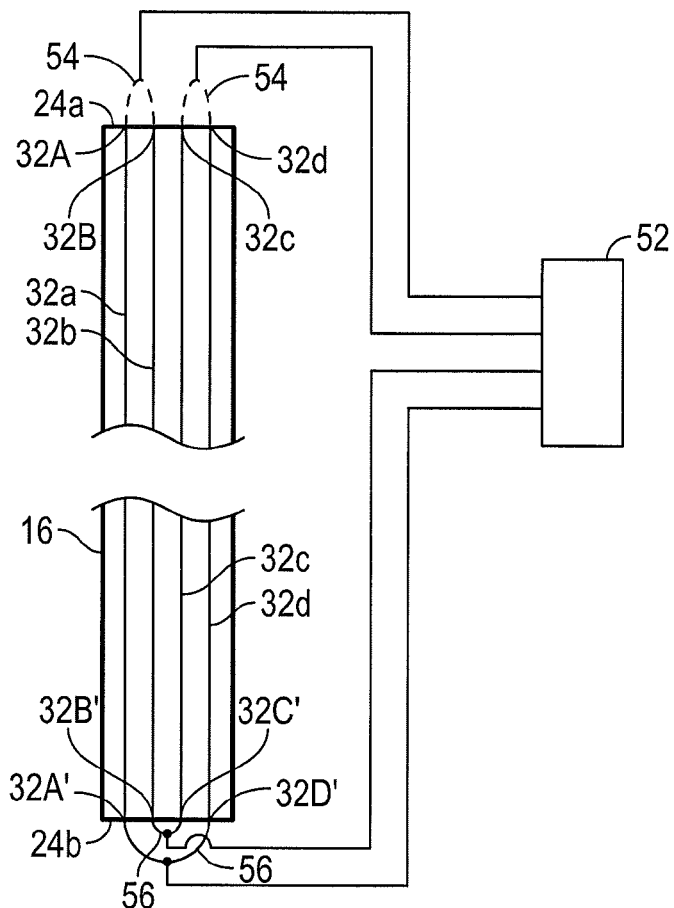
FIG. 5 is a schematic of an embodiment of an elevator belt fault detection unit.
Figure 6:
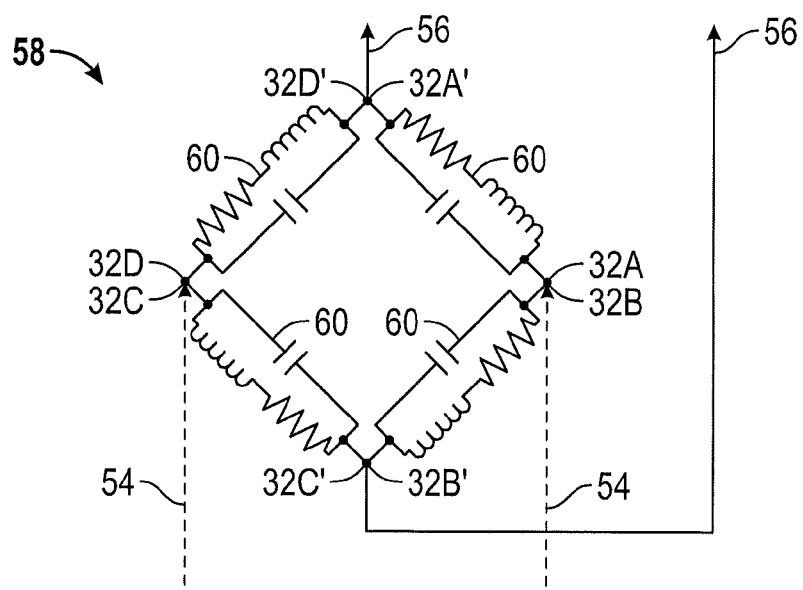
FIG. 6 is schematic circuit diagram for elevator belt fault detection.

Referring to FIG. 5, a fault detection unit 52 is electrically connected to a plurality of cords 32 of the belt 16. The fault detection unit 52 is connected to a terminated portion of the belt 16, for example, at an end 24a and/or 24b of the belt 16 located at the support 26 (shown in FIG. 1). The cords 32 are electrically connected to the fault detection unit 52 in a Wheatstone bridge configuration. In one embodiment, as shown in FIG. 5, each cord 32a, 32b, 32c and 32d of a four-cord 32 arrangement forms each leg of the Wheatstone bridge. Cord ends 32A and 32B are connected are connected via input leads 54, while cord ends 32C and 32D are connected via input leads 54. Other ends of cords 32a and 32b, referred to as 32A' and 32B' are connected via output lead 56, while ends of cords 32c and 32d, referred to as 32C' and 32D' are also connected by an output lead 56. The resulting bridge circuit 58 is shown in FIG. 6. Each leg 60 of the bridge circuit 58 is an LCR circuit allowing for measurement of complex impedance of the legs 60 or alternatively resistance of the legs 60. An excitation voltage is applied across the bridge circuit 58 via the input leads 54 from the fault detection unit 52 in the form of an AC voltage, or alternatively a DC voltage source, and the bridge circuit 58 outputs a signal voltage via output leads 56 to the fault detection unit 52. The fault detection unit 52 compares the excitation voltage to the signal voltage and evaluates an electrical impedance and/or electrical resistance of the belt 16. The measurements are dynamic such that changes in complex impedance or electrical resistance are evaluated by the detection unit 52 and are indicative of wear, fretting and wire breakage in the cords 32 of the belt 16. Configuring the cords 32 as a bridge circuit 58 suppresses noise from electromagnetic interference (EMI), temperature variation along a length of the cords 32, and tensile load variation along each cord 32. The connection scheme increases the total resistance of the circuit 58 and reduced the interrogating current through the cords 32, thus improving signal to noise ratio. Further, since the cords 32 are all interconnected in the circuit 58, all of the cords 32 are monitored simultaneously, thus reducing a number of required measurement channels.

Figure 7:
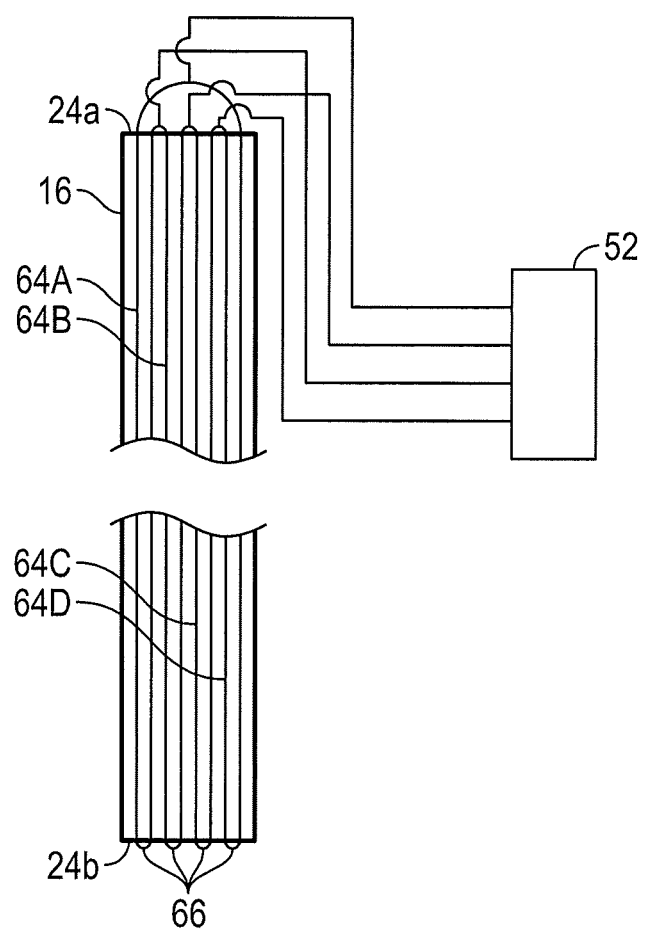
FIG. 7 is a schematic of another embodiment of an elevator belt fault detection unit.
Figure 8:
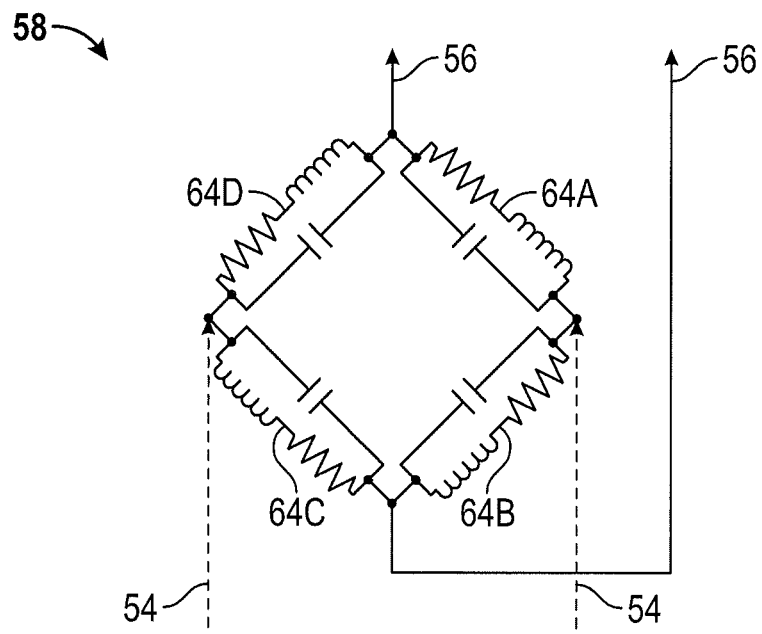
FIG. 8 is another schematic circuit diagram for elevator fault detection.

In another embodiment, as shown in FIG. 7, the belt 16 includes 8 cords 32, with adjacent cords 32 arranged in cord-pairs 64A, 64B, 64C and 64D. The configuration of FIG. 7 is utilized when, for example, the first end 24a of the belt 16 is fixed and the second end 24b is not fixed, as in the elevator system 10 of FIG. 2. In this embodiment, the individual cords 32 of each cord-pair 64A, 64B, 64C, 64D are connected at the second end 24b by jumper wires 66. At the first end 24a, the cord pairs 64A, 64B, 64C, 64D are interconnected to form the bridge circuit 58. For example, as shown in FIG. 7 and FIG. 8, cord-pair 64A is connected to cord-pair 64B, cord-pair 64B is connected to cord-pair 64C, cord-pair 64C is connected to cord-pair 64D, and cord-pair 64D is connected to cord-pair 64A. As in the embodiment of FIG. 6, voltage is applied across the bridge circuit 58 via the input leads 54 and output leads 56 from the fault detection unit 52 measures an electrical impedance and/or electrical resistance of the belt 16. Specifically, an output voltage at the output leads 56 indicates a difference in impedance of cord-pairs 64A and 64D from cord-pairs 64B and 64C, or inner cords 32 of the belt 16 compared to outer cords 32 of the belt 16. While the cords 32 of cord-pairs 64A, 64B, 64C and 64D are illustrated as connected external to the jacket 34, in some embodiments, the cords 32 are connected internal to the jacket 34. Further, while embodiments of belts 16 having 4 or 8 cords 32 are illustrated, it is to be appreciated that in other embodiments, belts 16 having any number of cords 32 four or greater may be utilized, with select cords 32 connected as bridge circuit 58 at any one time.

Figure 9:
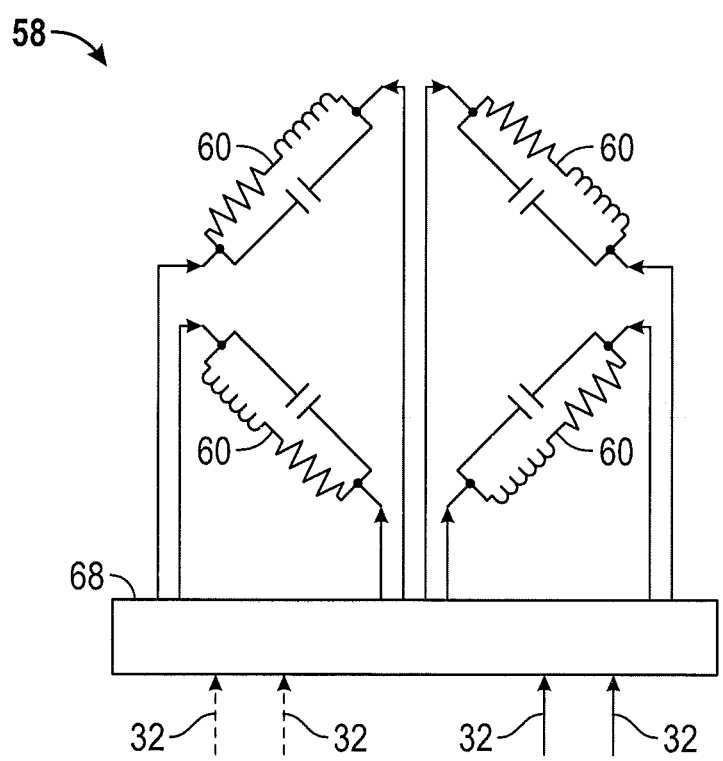
FIG. 9 is yet another embodiment of an elevator belt fault detection unit.

In another embodiment, as shown in FIG. 9, the cords 32 are connected to a switch array 68 including one or more relays or other switching elements. In this embodiment, the cords 32 are selectably connected fault detection unit 52. In belts 16 having greater than 4 cords 32, this allows for selection of cords 32 or multiples of cords 32 for assessment. Further, with the selective connection of a single cord 32, the fault detection unit 52 may assess the condition of the single cord 32 via, for example, a traditional resistance-based inspection process.

Figure 10:
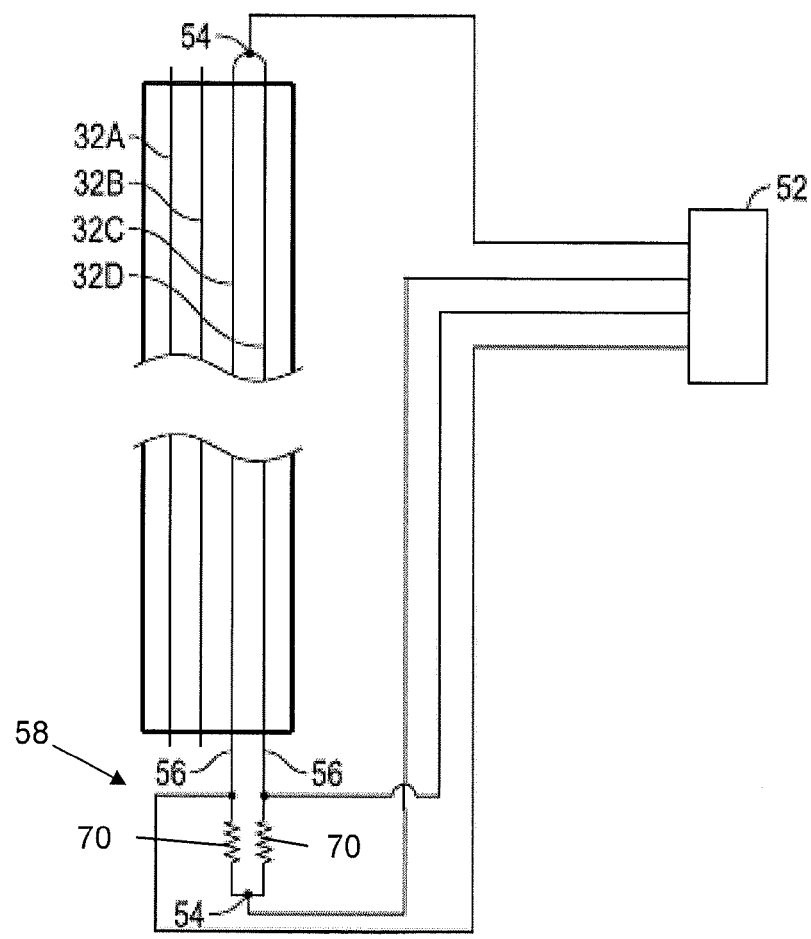
FIG. 10 is still another embodiment of an elevator belt fault detection unit.
Figure 11:
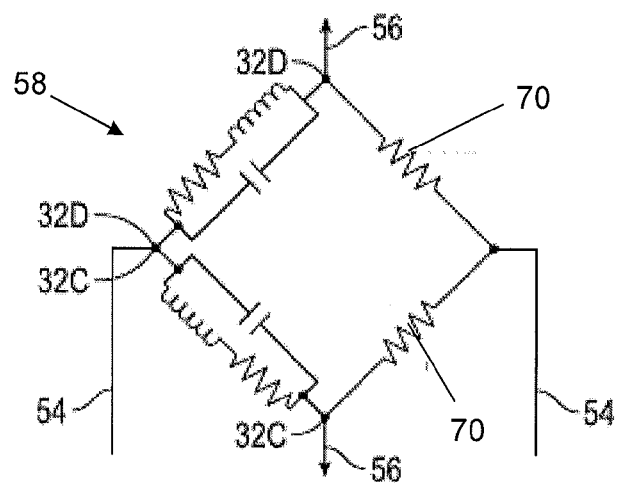
FIG. 11 is a schematic circuit diagram of the embodiment of FIG. 10.

Referring now to FIGS. 10-15, a combination of cords 32 and fixed resistors 70 may be used to define the bridge circuit 58. As shown in FIGS. 10 and 11, two cords, in this embodiment 32c and 32d are used in combination with two resistors 70, for example, two low inductance resistors 70, to form the bridge circuit 58. Output leads 56 are connected between cords 32 and resistors 70 and the fault detection unit 52 essentially compares the complex impedance of the cords 32c and 32d to the impedance of the fixed resistors 70. The impedance of the fixed resistors 70 is stable, while the impedance of cords 32c and 32d is variable, so change in impedance of the cords 32c, 32d is more easily detectable. In some embodiments, the resistor 70 legs are low inductance and may also be temperature matched utilizing thermocouples and heaters (not shown). Further, the resistors 70 are matched to the cord impedance within 0.5 to 10× of the cord impedance.

Figure 12:
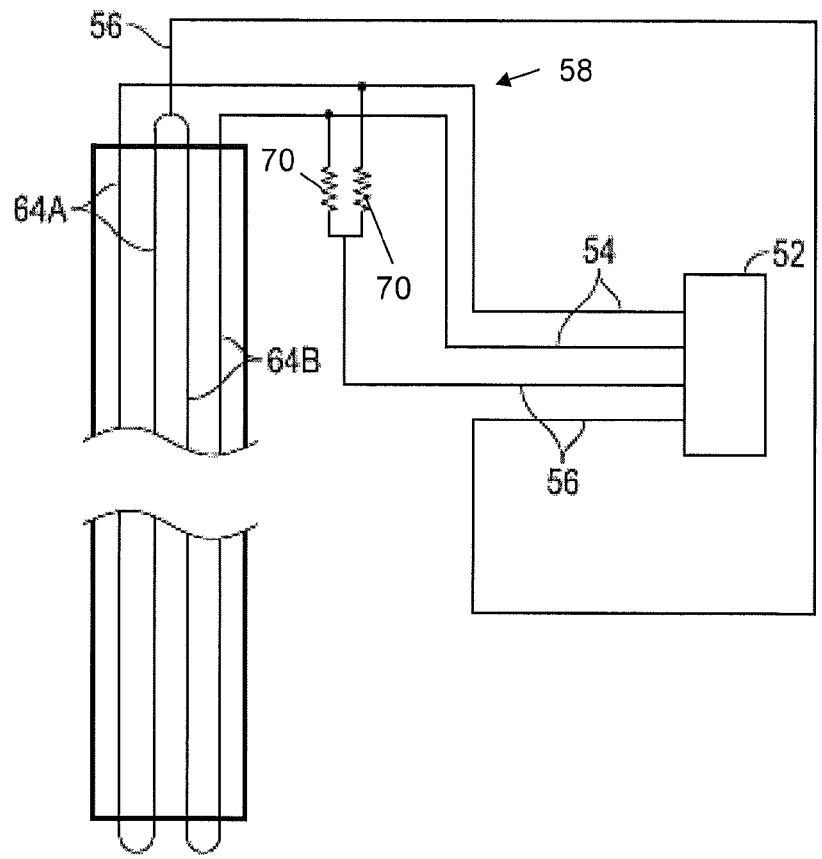
FIG. 12 is another embodiment of an elevator belt fault detection unit.
Figure 13:
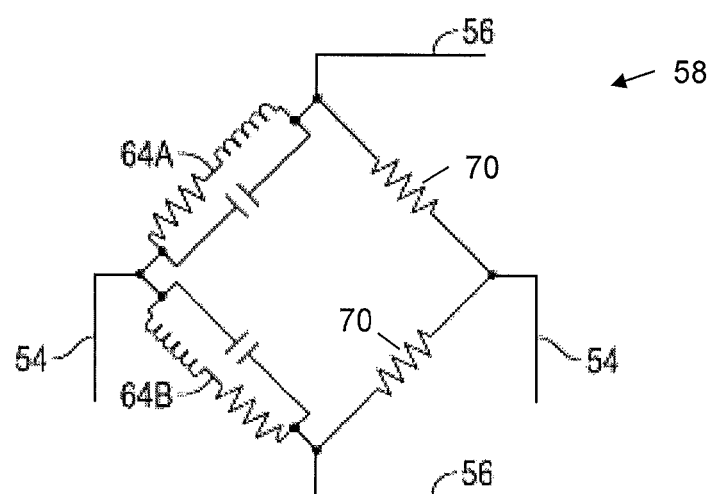
FIG. 13 is a schematic circuit diagram of the embodiment of FIG. 12.

In another embodiment, as shown in FIGS. 12 and 13, cord pairs 64A and 64B are connected to form two legs of the bridge circuit 58, while resistors 70 for the other two legs. The behavior of this bridge circuit 58 is similar to that of the circuit in FIGS. 10-11, but with higher levels of cord impedance. Additional cords 32 may be connected in series to form legs 64A and 64B.

Figure 14:
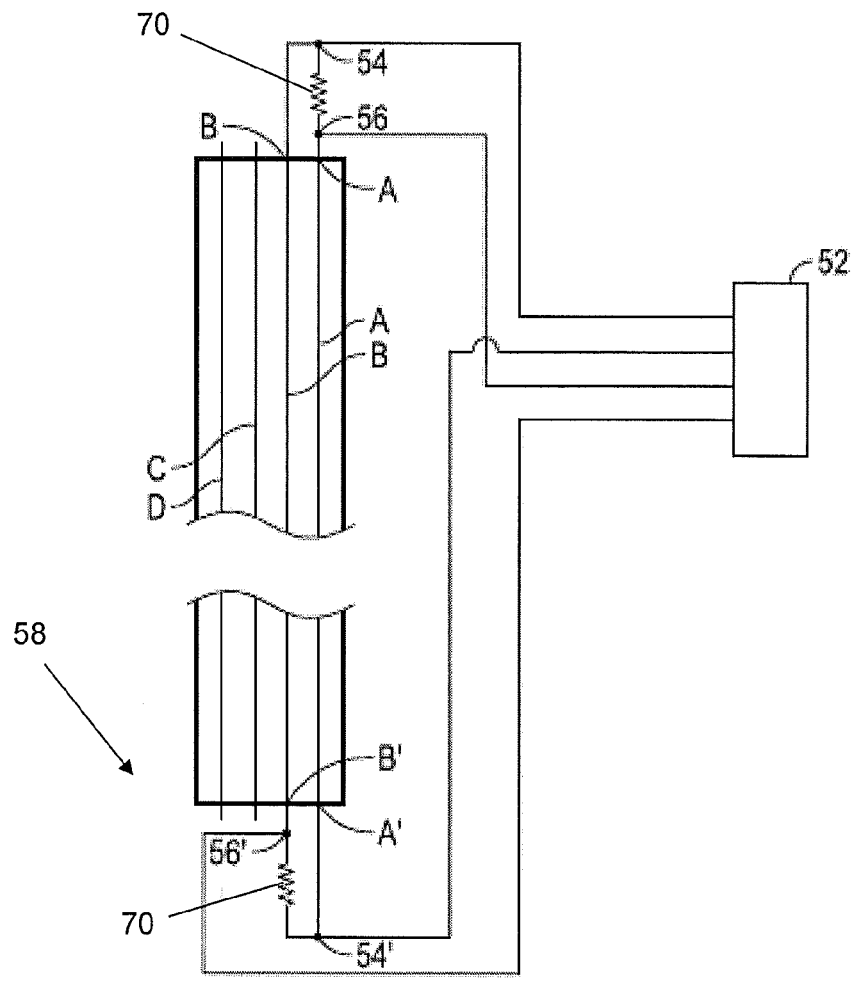
FIG. 14 is still another embodiment of an elevator belt fault detection unit.
Figure 15:
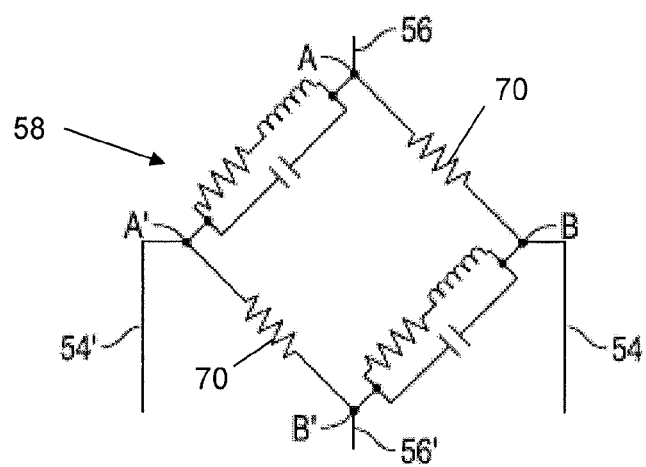
FIG. 15 is a schematic circuit diagram of the embodiment of FIG. 14.

Referring to FIGS. 14 and 15, in some embodiments, the cords 32 and resistors 70 are interconnected such that the bridge circuit 58 is formed with cords 32 at opposing legs, and likewise resistors 70 at opposing legs, as opposed to at adjacent legs as in other embodiments. In this embodiment, an increase in complex impedance in the cords 32 will unbalance the bridge in opposite directions, resulting in approximately double the measurable signal at the fault detection unit 52. Thus a smaller change in impedance in the cords 32 is detectable.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method of fault detection of a belt or rope comprising:
   interconnecting a plurality of cords of the belt or rope, the cords including a plurality of wires, to form a bridge circuit, at least two legs of the bridge circuit comprising separate and distinct cords of the plurality of cords;
   subjecting the bridge circuit to an excitation voltage;
   outputting a signal voltage from the bridge circuit, the bridge circuit structure suppressing environmental noise to increase signal to noise ratio of the signal voltage; and
   monitoring the signal voltage to detect a fault condition of the rope,
   wherein each leg of the bridge circuit is configured as an LCR circuit allowing for measurement of complex impedance of the legs of the bridge circuit.

2. The method of claim 1, wherein the output voltage is proportional to an impedance difference between cords of the plurality of cords.

3. The method of claim 2, wherein the output voltage is indicative of an impedance difference between laterally inner cords of the belt and laterally outer cords of the belt.

4. The method of claim 1, wherein at least one leg of the bridge circuit comprises a fixed resistor.

5. The method of claim 4, wherein two legs of the bridge circuit each comprise at least one cord and two legs of the bridge circuit each comprise a fixed resistor.

6. The method of claim 1, further comprising comparing the signal voltage to the excitation voltage in magnitude and phase to detect the fault condition of the rope.

7. The method of claim 1, further comprising:
   comparing a profile of a measured electrical impedance to a baseline electrical impedance profile; and
   determining a fault condition of the belt or rope via the comparison.

8. The method of claim 1, wherein each leg of the bridge circuit comprises at least one cord of the belt or rope.

9. The method of claim 8, wherein each leg of the bridge circuit comprises two or more cords of the belt or rope.

10. The method of claim 1, wherein fault conditions include wire breakage, fretting and/or birdcaging.

11. The method of claim 1, wherein the electrical impedance is measured substantially continuously.

12. The method of claim 1, further comprising switching the interconnection of the plurality of cords via a switching mechanism operably connected to the plurality of cords.

13. The method of claim 1, wherein the excitation voltage is supplied from an AC voltage source.

14. An elevator system comprising:
   an elevator car;
   one or more sheaves;
   a belt or rope comprising a plurality of wires arranged into a plurality of cords for supporting and/or driving the elevator car routed across the one or more sheaves and operably connected to the elevator car, the plurality of cords interconnected to form a bridge circuit, at least two legs of the bridge circuit comprising separate and distinct cords of the plurality of cords;
   wherein each leg of the bridge circuit is configured as an LCR circuit allowing for measurement of complex impedance of the legs of the bridge circuit.

15. The elevator system of claim 14, wherein each leg of the bridge circuit comprises at least one cord of the belt or rope.

16. The elevator system of claim 15, wherein each leg of the bridge circuit comprises two or more cords of the belt or rope.

17. The elevator system of claim 14, wherein at least one leg of the bridge circuit comprises a fixed resistor.

18. The elevator system of claim 17, wherein two legs of the bridge circuit each comprise at least one cord and two legs of the bridge circuit each comprise a fixed resistor.

19. The elevator system of claim 14, further comprising a switching element operably connected to the plurality of cords to change an interconnection configuration of the plurality of cords.

20. The elevator system of claim 14, further comprising an AC voltage source operably connected to the belt or rope.

21. The elevator system of claim 14, wherein the belt or rope is a coated belt or rope.

* * * * *